United States Patent
Dykeman et al.

(10) Patent No.: US 9,286,333 B2
(45) Date of Patent: Mar. 15, 2016

(54) STREAM COMPRESSION AND DECOMPRESSION

(75) Inventors: Harold Douglas Dykeman, Richterswil (CH); Francesco Fusco, Zurich (CH); Thomas R. Locher, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 455 days.

(21) Appl. No.: 13/553,457

(22) Filed: Jul. 19, 2012

(65) Prior Publication Data

US 2013/0024434 A1 Jan. 24, 2013

(30) Foreign Application Priority Data

Jul. 22, 2011 (EP) .................................. 11175119

(51) Int. Cl.
*G06F 7/00* (2006.01)
*G06F 17/00* (2006.01)
*G06K 9/36* (2006.01)
*G06K 9/46* (2006.01)
*H04N 7/12* (2006.01)
*H04N 11/02* (2006.01)
*G06F 17/30* (2006.01)
*G06F 9/45* (2006.01)
*G06F 17/22* (2006.01)
*H03M 7/30* (2006.01)
*G06F 3/12* (2006.01)

(52) U.S. Cl.
CPC .... *G06F 17/30306* (2013.01); *G06F 17/30516* (2013.01); *G06F 3/1297* (2013.01); *G06F 8/4434* (2013.01); *G06F 17/2252* (2013.01); *H03M 7/30* (2013.01)

(58) Field of Classification Search
CPC . G06F 8/4434; G06F 3/1297; G06F 9/30178; G06F 11/3082; H03M 7/30
USPC .......................... 707/693; 382/232, 233, 235; 375/240.25
See application file for complete search history.

(56) References Cited

U.S. PATENT DOCUMENTS 6,195,391 B1 * 2/2001 Hancock et al. ......... 375/240.24
2003/0212879 A1 * 11/2003 Henkel et al. ................. 712/208

OTHER PUBLICATIONS

Vlachos et al. "Real-time creation of bitmap indexes on streaming network data" Dec. 9, 2010 IBM Research—Zurich, Ruschlikon, Swizerland.*

(Continued)

*Primary Examiner* — Taelor Kim
*Assistant Examiner* — Berhanu Mitiku
(74) *Attorney, Agent, or Firm* — Fleit Gibbons Gutman Bongini & Bianco PL; Jon A. Gibbons (57) ABSTRACT

A method for compressing a sequence of records, each record comprising a sequence of fields, comprises steps of buffering a record in a line of a matrix, reordering the lines of the matrix according to locality sensitive hash values of the buffered records such that records with similar contents in corresponding fields are placed in proximity, and consolidating fields in columns of the matrix into a block of codes. In this, consolidating yields codes of one of a first type comprising a sequence of individual fields and a second type comprising a sequence of fields with at least one repetition. The second type of code comprises a presence field indicating repeated fields and an iteration field indicating a number of respective repetitions. Decompression of the records from the block codes compressed above is also described.

8 Claims, 8 Drawing Sheets

(56) References Cited

OTHER PUBLICATIONS

Stoechklin et al. "NET-FLI: On-the-fly Compression, Archiving and Indexing of Streaming Network Traffic" 36th International Conference on Very Large Data Bases Sep. 13-17, 2010, Singapore. VLDB Endowment, vol. 3. No. 2.*

Fusco, F., et al., "RasterZip: Archiving Streaming Data with Support for Partial Decompression," VLDB '11, Aug. 29-Sep. 3, 2011, Seattle, WA, copyright 2011 VLDB Endowment, ACM 000-0-00000-000-0/00/00.

Fusco, F., "RasterZIP: Prefix Data Compression with Partial Decompression," VLDB '11, Aug. 29-Sep. 3, 2011, Seattle, WA, copyright 2011 VLDB Endowment, ACM 000-0-00000-000-0/00/00.

Non-Final Rejection dated Jul. 8, 2014 received for U.S. Appl. No. 13/758,175.

Fusco, F. et al. "GridZip: Network Traffic Data Compression with Partial Decompression", pp. 1-7.

Fusco, F. et al. "RasterZip: Compressing Network Monitoring Data with Support for Partial Decompression", IMC '12, Nov. 14-16, 2012, pp. 1-14.

Endace Measurement Systems, NinjaProbe Applicances, "Emulex Endace Visibility Products" Downloaded online on Jun. 3, 2015, pp. 1-2. http://endace.com.

Abadi, D., et al., "Integrating Compression and Execution in Column-Oriented Database Systems," SIGMOD, Jun. 27-29, 2006, pp. 1-12.

Abadi, D., et al., "The Design of the Borealis Stream Processing Engine," CIDR conference, Jan. 4-7, 2005, pp. 1-13.

Anh, V., et al., "Inverted Index Compression Using Word-Aligned Binary Codes," Jan. 6, 2004, pp. 151-166, vol. 8.

Bilodeau, M., et al., "Equipment Maintenance Focus in Defect Density Improvements," IBM Microelectronics, ASMC, May 4-6, 2004, pp. 22-26.

Botan, I., et al., "Flexible and Scalable Storage Management for Data-intensive Stream Processing," EDBT, ACM, Mar. 24-26, 2009, pp. 1-12.

Chandrasekaran, S., et al., "TelegraphCQ: Continuous Dataflow Processing," SIGMOD, Jun. 9-12, 2003, p. 668.

Chang, F., et al., "Bigtable: A Distributed Storage System for Structured Data," ACM Transactions on Computer Systems, Jun. 2008, pp. 1-26. vol. 26, No. 2, Article 4.

Claise, E., "Cisco Systems NetFlow Services Export Version 9," Network Working Group, Cisco Systems, Oct. 2004, pp. 1-33.

Cranor, C., et al., "Gigascope: A Stream Database for Network Applications," SIGMOD, Jun. 9-12, 2003, pp. 647-651.

Datar, M., et al., "Locality-Sensitive Hashing Scheme Based on p-Stable Distributions," SCG, Jun. 9-11, 2004, pp. 253-262.

Dindar, N., et al., "DejaVu: Declarative Pattern Matching over Live and Archived Streams of Events," SIGMOD, Jun. 29-Jul. 2, 2009, pp. 1023-1025.

Duffield, N., et al., "Charging from Sampled Network Usage," AT&T Labs—Research, Sep. 2009, pp. 1-12.

Enke, H., et al., "AstroGrid-D: Grid Technology for Astronomical Science," Jul. 2010, pp. 1-14.

Feldmann, A., et al., "Deriving Traffic Demands for Operational IP Networks: Methodology and Experience," IEEE/ACM Transactions on Networking, Jun. 2001, pp. 265-279, vol. 09, No. 03.

Ferragina, P., "Data Structures: Time, I/Os, Entropy, Joules!" ESA, Sep. 6-8, 2010, pp. 1-16.

Ferragina, P., et al., "Opportunistic Data Structures with Applications," Conference: Foundations of Computer Science, Nov. 12-14, 2000, pp. 390-398.

Friedl, A., et al., "Perfmon and Servmon: Monitoring operational status and resources of distributed computing systems," CESNET Technical Report, Nov. 16, 2008, pp. 1-9.

Gates, C., et al., "More Netflow Tools: For Performance and Security," 18th Large Installation System Administration Conference—Technical Paper, Nov. 2004, pp. 1-15.

Gionis, A., et al., "Similarity Search in High Dimensions via Hashing," 25th VLDB Conference, Sep. 7-10, 1999, pp. 518-529.

Giura, P., et al., "NetStore: An Efficient Storage Infrastructure for Network Forensics and Monitoring," RAID, Sep. 15-17, 2010, pp. 277-296.

Grossi, R., et al., "Compressed Suffix Arrays and Suffix Trees with Applications to Text Indexing and String Matching", Siam Journal on computing, Oct. 17, 2005, pp. 378-407. vol. 35, No. 02.

Sourceforge.net., "NFDUMP," Dec. 1, 2014, pp. 1-8.

Kuntschke, R., et al., "Grid-based Data Stream Processing in e-Science," Proceedings of the Second IEEE International Conference on e-Science and Grid Computing, Dec. 4-6, 2006, pp. 1-8.

Lakhina, A., et al., "Mining Anomalies Using Traffic Feature Distributions," SIGCOMM, Aug. 22-26, 2005, pp. 217-228.

Lemire, D., et al., "Sorting improves word-aligned bitmap indexes," Data & Knowledge Engineering, Sep. 1, 2009, pp. 1-26. vol. 69.

Lv, Q., et al., "Multi-Probe LSH: Efficient Indexing for High-Dimensional Similarity Search," VLDB, Sep. 23-28, 2007, pp. 950-961.

Lzop., "Izop File Compressor, Version 1.03," Nov. 1, 2010, pp. 1-3.

Oetiker, T., "MRTG—The Multi Router Traffic Grapher," Proceedings of the 12th Systems Administration Conference, Dec. 6-11, 1998, pp. 1-14.

Plagemann, T., et al., "Using Data Stream Management Systems for Traffic Analysis—A Case Study," PAM, LNCS 3015, Apr. 19-20, 2004, pp. 1-12.

Quittek, J., et al., "Requirements for IP Flow Information Export (IPFIX)," Network Working Group, Oct. 2004, pp. 1-67.

Fullmer, M., et al., "The OSU Flow-tools Package and Cisco NetFlow Logs," LISA XIV, Dec. 3-8, 2000, pp. 291-304.

Sadakane, K., "Succinct Representations of Icp Information and Improvements in the Compressed Suffix Arrays," 13th annual ACM—SIAM symposium on Discrete algorithms, Jan. 2002, pp. 225-232.

Schatzmann, D., et al., "FACT: Flow-Based Approach for Connectivity Tracking," PAM, LNCS 6579, Mar. 20-22, 2011, pp. 1-10.

Stonebraker, M., et al., "C-Store: A Column-oriented DBMS," 31st VLDB Conference, Aug. 30-Sep. 2 2005, pp. 1-12.

Sullivan, M., et al., "Tribeca: A System for Managing Large Databases of Network Traffic," Proceedings of the USENIX Annual Technical Conference, Jun. 1998, pp. 1-13.

Vo, B., et al., "RadixZip: Linear Time Compression of Token Streams," VLDB, Sep. 23-28, 2007, pp. 1162-1172.

Wu, K., et al., "Challenges and Experience in Prototyping a Multi-Modal Stream Analytic and Monitoring Application on System S," VLDB, Sep. 23-28, 2007, pp. 1185-1196.

Ziv, J., et al., "A Universal Algorithm for Sequential Data Compression," IEEE Transactions on Information Theory, May 1977, pp. 337-343, vol. 23, No. 03.

Zukowski, M., et al., "Super-Scalar RAM—CPU Cache Compression," Proceedings of the 22nd International Conference on Data Engineering, Apr. 3-7, 2006, pp. 1-12.

* cited by examiner

STREAM COMPRESSION AND DECOMPRESSION

CROSS-REFERENCE TO RELATED APPLICATIONS

This application is based upon and claims priority from prior Swiss Patent Application No. 11175194.4, filed on Jul. 22, 2011 the entire disclosure of which is herein incorporated by reference.

FIELD OF THE INVENTION

The present invention relates to a system and a method for data stream compression and another system and another method for data stream decompression. The invention also relates to a computer program product for carrying out one of the methods.

BACKGROUND OF THE INVENTION

In many technical applications, a stream of data is generated which must be recorded for later analysis. Such applications may be found in domains such as network forensics and cyber-security, scientific data analysis (e.g. archiving and analysis of astronomical measurements), and monitoring applications (e.g. in sensor networks). Often, the amount of data generated per time is very large so that extremely fast processing is mandatory to prevent the processing systems from clogging up with data.

In known archiving solutions, accessing the archived data may be slow because searching and decompressing the requested data is a computationally intensive task.

SUMMARY OF THE INVENTION

Embodiments of aspects of the invention provide methods with the features of claims 1 and 3, computer program products with the features of claim 10 and apparatuses with the features of claims 11 and 12. Dependent claims denote advantageous embodiments.

According to an embodiment of a first aspect of the invention, a method for compressing a sequence of records, each record comprising a sequence of fields, comprises steps of buffering a record in a line of a matrix, reordering the lines of the matrix according to locality sensitive hash values of the buffered records in such a way that records with similar contents in corresponding fields are placed in proximity, and consolidating fields from columns of the matrix into a block of codes. In this, consolidating yields codes of a first type comprising a sequence of individual fields or a second type comprising a sequence of fields with at least one repetition. The second type of code may comprise a presence field indicating repeated fields and an iteration field indicating a number of respective repetitions. Presence and iteration fields may be implemented as bitmaps.

The resulting codes may advantageously provide a high compression ratio especially for data that comprises fixed fields such as header fields of TCP packets, time-tagged data or categorized measurements. Furthermore, the resulting codes may allow simplified access to the data without the requirement of decompressing all blocks containing data of interest.

Preferably, a sequence of less than three repeated fields is treated as two individual fields. It was found that by this optimization, the overhead of creating a code of the second type may be saved in many cases, resulting in a better performance of the compression method.

According to an embodiment of a second aspect of the invention, a method for decompressing records from a block of codes as mentioned above comprises steps of, for each code that is to be extracted from the block, determining the type of the code, decompressing the sequence of individual fields if the code is the first type, and decompressing the sequence of repeated fields if the code is of the second type.

The proposed decompression method may result in fast decompression of a block of codes. Steps of the methods may advantageously be carried out using highly efficient operations such as memcpy( ) on a system executing the decompression method.

Preferably, the method further comprises a preceding determination which codes must be decompressed for obtaining a predetermined record.

Through this, it is possible to either perform a full decompression of the block or to decompress only those codes that contain information of the predetermined record. The effort for a full decompression may be traded off against the effort of determination and the possibly more complex operations required for a partial decompression. Overall performance of the decompression method may thus be further increased.

In one preferred embodiment, the fields are extracted into a matrix with lines representing records, the matrix being addressable in linearized form in such a way that each field of each record has an offset address in the linearized matrix and determination which codes must be decompressed for obtaining a predetermined record comprises the steps of determining an offset address for each field of the predetermined record and, for each code in the block, determining a range of offset addresses the code decompresses to and determining that the code must be decompressed if the range comprises at least one offset address in the set.

This approach may avoid the decompression of any codes that decompress to information that is not required. A memory requirement of the decompression method may be lowered and execution time may be reduced.

In a preferred embodiment, a grid of slots is logically superimposed on the matrix in order to reduce the number of comparisons. Specifically, determination in this embodiment comprises the steps of determining an offset address for each field of the predetermined record, linearly rescaling the determined offset address with a predetermined factor and setting a bit in a bitmap at the rescaled offset address to a predetermined value and, for each code in the block, determining a range of offset addresses the code decompresses to, linearly rescaling the range of offset addresses with the predetermined factor and determining that the code must be decompressed if the bitmap contains a bit with the predetermined value at a rescaled address that falls within the rescaled range of offset addresses.

By using the predetermined factor for rescaling all offset addresses, determination whether a code needs to be decompressed may require a reduced number of comparisons, thus increasing performance of the decompression method. Comparison of bit in the bitmap may exploit a bit-counting assembly instruction as provided by many execution systems. The predetermined factor is a tunable parameter that allows to trade off precision for performance.

Preferably, the decompression method further comprises a preceding step of determining whether to decompress all codes of the block or to employ partial decompression as described above. This decision is based on at least one of a compression ratio and a selectivity, wherein the compression ratio indicates a quotient of the size of the block of codes by the size of the decompressed records and the selectivity indicates a quotient of the number of records to be decompressed by the number of records in the block.

According to an embodiment both the compression ratio and the selectivity are parameters that may be accessible from the block of codes without actually decompressing any code of the block. The choice of decompression strategies may thus be made fast and with respect to each individual block. Empirical knowledge concerning the most advantageous decompression strategy for past blocks of code may be employed for making the decision. Thus, characteristics of the compressed data inside of the records as well as the machine executing the decompression method may be exploited. By occasional verification of the choice made between partial and full decompression, an adaptive decompression strategy may be implemented. Preferably, separate index data is provided for each block of codes, the index data comprising information that allows computation of the compression ratio and/or the selectivity. The index data may further comprise information on the kind of data that is included inside of the block so that a search for specific data may be run against the index data first and in case of a hit, records containing the actual data may be decompressed from the corresponding blocks of codes.

In a preferred embodiment of the invention, the determination whether to use full or partial decompression is carried out on the basis of a table indicating the method to use for different combinations of compression ratio and selectivity. Both compression ratio and selectivity may be graduated to form row and column addresses of the table, wherein elements of the table contain an indication of the preferred method to use. Thus, a very fast determination of the more advantageous decompression strategy may be implemented. This approach may require a modest memory footprint and offer the opportunity to amend individual entries in the table to facilitate the above mentioned adaptive choice.

In one embodiment, elements of the table hold an indication of an average effort for carrying out full and/or partial decompression. The effort may e.g. be expressed in units of processing time or complexity. Thus, information in the table may be updated in order to adapt the choice to the data.

According to an embodiment of a third aspect of the invention, a computer program product implementing one of the above-indicated methods is run on an processing unit or stored on a computer-readable medium.

According to an embodiment of a fourth aspect of the invention, a compression apparatus for compressing a sequence of records, each record comprising a sequence of fields, comprises a storage in matrix organization for accepting and buffering a record in a line of the matrix, reordering means for determining locality sensitive hash values of the buffered records and for reordering the lines of the matrix according to the determined hash values in such a way that records with similar contents in corresponding fields are placed in proximity, and consolidating means for consolidating fields in columns of the matrix into a block of codes and for outputting the block of codes. The consolidating means are adapted to yield codes of a first type comprising a sequence of individual fields or a second type comprising a sequence of fields with at least one repetition. The second type of code may comprise a presence field indicating repeated fields and an iteration field indicating the number of respective repetitions. The presence field may be a bitmap and the iteration field may be an array.

The compression apparatus may advantageously comprise a programmable computer or microcomputer executing the above-mentioned compression method.

According to an embodiment of a fifth aspect of the invention, a decompression apparatus for decompressing records from a block of codes, the block having a structure like the block outputable by the above-mentioned apparatus or the compression method above, comprises elements of determination means for determining the type of each of the codes in the block, first decompression means for decompressing the sequence of individual fields if the code is of the first type and second decompression means for decompressing the sequence of repeated fields if the code is of the second type. The two means for decompression may be identical in some embodiments.

The decompression apparatus may preferably comprise a programmable computer or microcomputer executing the above-mentioned decompression method.

Both the compression and the decompression apparatus may easily be integrated into a communication or measurement system where large volumes of data need to be archived and processed at a later time. Efficiency of data analysis may thus be improved which may lead to cost and advantages and improved control over the data. Especially in data analysis that comprises access to a varying number of records per block of codes, the decompression method and the decompression apparatus may be advantageously used. Such analysis often must be performed in "needle in a haystack" type of searches, which are common for network forensics.

BRIEF DESCRIPTION OF THE DRAWINGS

The invention will now be explained with reference to the enclosed drawings, in which.

DESCRIPTION OF THE PREFERRED EMBODIMENTS

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and vice versa with no loss of generality.

The flowcharts and block in the figures illustrate the system, methods, as well as architecture, functions and operations executable by a computer program product according to the embodiments of the present invention. In this regard, each block in the flowcharts or block may represent a module, a program segment, or a part of code, which contains one or more executable instructions for performing specified logic functions. It should be noted that, in some alternative implementations, the functions noted in the blocks may also occur in a sequence different from what is noted in the drawings. For example, two blocks shown consecutively may be performed in parallel substantially or in an inverse order. This depends on relevant functions. It should also be noted that each block in the block diagrams and/or flowcharts and a combination of blocks in the block diagrams and/or flowcharts may be implemented by a dedicated hardware-based system for performing specified functions or operations or by a combination of dedicated hardware and computer instructions.

Hereinafter, the principle and spirit of the present invention will be described with reference to various exemplary embodiments. It should be understood that provision of these embodiments is only to enable those skilled in the art to better understand and further implement the present invention, not intended for limiting the scope of the present invention in any manner.

Hereinafter, various embodiments of the present invention will be described in detail with reference to the drawings.

Figure 1:
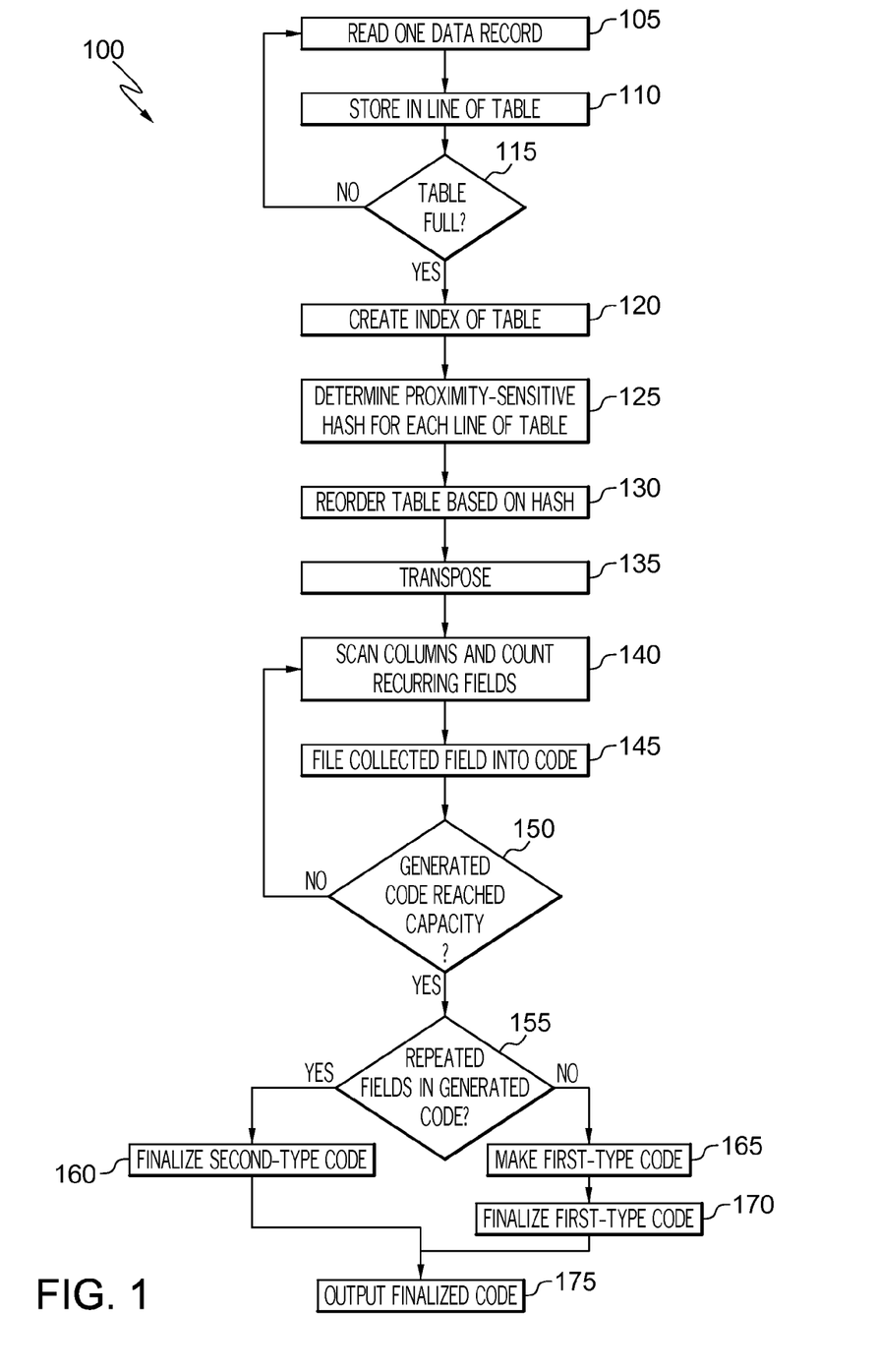
FIG. 1 shows a flowchart of a data compression method.

FIG. 1 shows a flowchart of a data compression method 100. Method 100 starts in a step 105, in which one record of data is read. The record contains at least one field that is preferably of fixed size and position in the record. Furthermore, it is preferred that the field stands at or near the beginning of the record. One example for such a record is a TCP packet in which several fixed width header fields for source and destination addresses, ports, protocol and other information are provided.

In a step 110, the record is stored in a line of a table. The table has sufficient width to accommodate the whole record and will preferably comprise a predetermined number of lines for accommodating a corresponding number of records.

In a step 115, it is determined whether the table is full after the record has been stored in the table in step 110. In other embodiments of the method, it can also be tested in step 115 whether the table is filled above a certain degree, e.g. 95%. If the table is found to have space left, method 100 loops back to step 105. Otherwise, it proceeds with an optional step 120 in which an index for the table is created. The index will later be stored along with the compressed data of the table so that the index can be searched for specific information before the corresponding data is extracted, i.e. decompressed for further analysis. The index will preferably be searchable for contents of the one or more header field and indicate if the block of codes comprises a record with fields containing such contents. The index may also comprise statistical and/or summary information on the records and/or the codes. Such information may comprise a compression ratio, a compressed size and a decompressed size of the records.

In a step 125, a proximity-sensitive hash is determined for each line of the table. As is known in the art, a hash value for an object represents an expression, often of fixed size, that is characteristic for every property of the object. Should the object be changed at all, the corresponding hash will also change. A locality sensitive hash value is a special kind of hash value that has the property that it changes with the object in an analogous way. That is, two objects that are largely identical and only differ in a few places will have locality sensitive hash values that differ only slightly. As a measure for the difference between two objects or hash values, the Hamming distance may be employed.

In a step 130, the table is reordered according to the generated locality sensitive hash values, thus placing records with similar content in corresponding fields in relative proximity inside the table. In a following step 135, the matrix may be transposed. The transposition of step 135 does not have to be physically carried out on the table. Alternatively, it may be sufficient to adapt the addressing of the matrix so that a columnar access instead of a line-wise access is possible. On a computer system, the table may be kept in a memory in linearized form. In this case, accessing the matrix in columnar form may be done through a well-known address transposition mechanism.

In a step 140, the matrix is scanned in columnar fashion and recurring fields are counted. In a preferred embodiment of the invention, a sequence of two identical consecutive fields is treated as two individual fields, while three or more identical consecutive fields are treated as a recurrence.

In a following step 145, the collected field is filed into a code. There are two types of codes available, a first type comprising a sequence of individual fields and a second type that additionally comprises a presence field and an iteration field. The presence field, which is be stored as a bitmap preceding the sequence of fields, indicates which of the fields represent a plurality of identical consecutive fields. The iteration field, which may be stored as a vector appending the sequence of fields, denotes the number of iterations for each field indicated by the presence field. The first type code my thus be considered a special case of the second type code in which no recurring fields are stored. Therefore, in step 145, the collected field is filed into a type two code and the corresponding elements in the presence and iteration fields are set if the collected field represents a plurality of fields.

In a step 150, it is determined whether the generated code has reached its capacity. If there is room left inside of the code, method 100 loops back to step 140. Otherwise, in a step 155 it is determined whether the generated code contains any repeated fields. If this is the case, the second-type code is finalized in a step 160 in which an indication of the type of code is introduced. This indication may be stored as leading information in the generated code.

If it is determined in step 155 that there are no recurring fields inside of the generated code, the presence and iteration fields are removed from the second-type code, thus making it a first-type code. In a step 170, the first-type code is finalized by introducing an indication for the type of code.

After one of steps 160 and 170, the finalized code of type one or type two is output and method 100 may terminate or loop back to step 105 to compress more records into a code. A predetermined number of generated codes may form a block of codes that may be supplied with the information generated in step 120.

Figure 2:
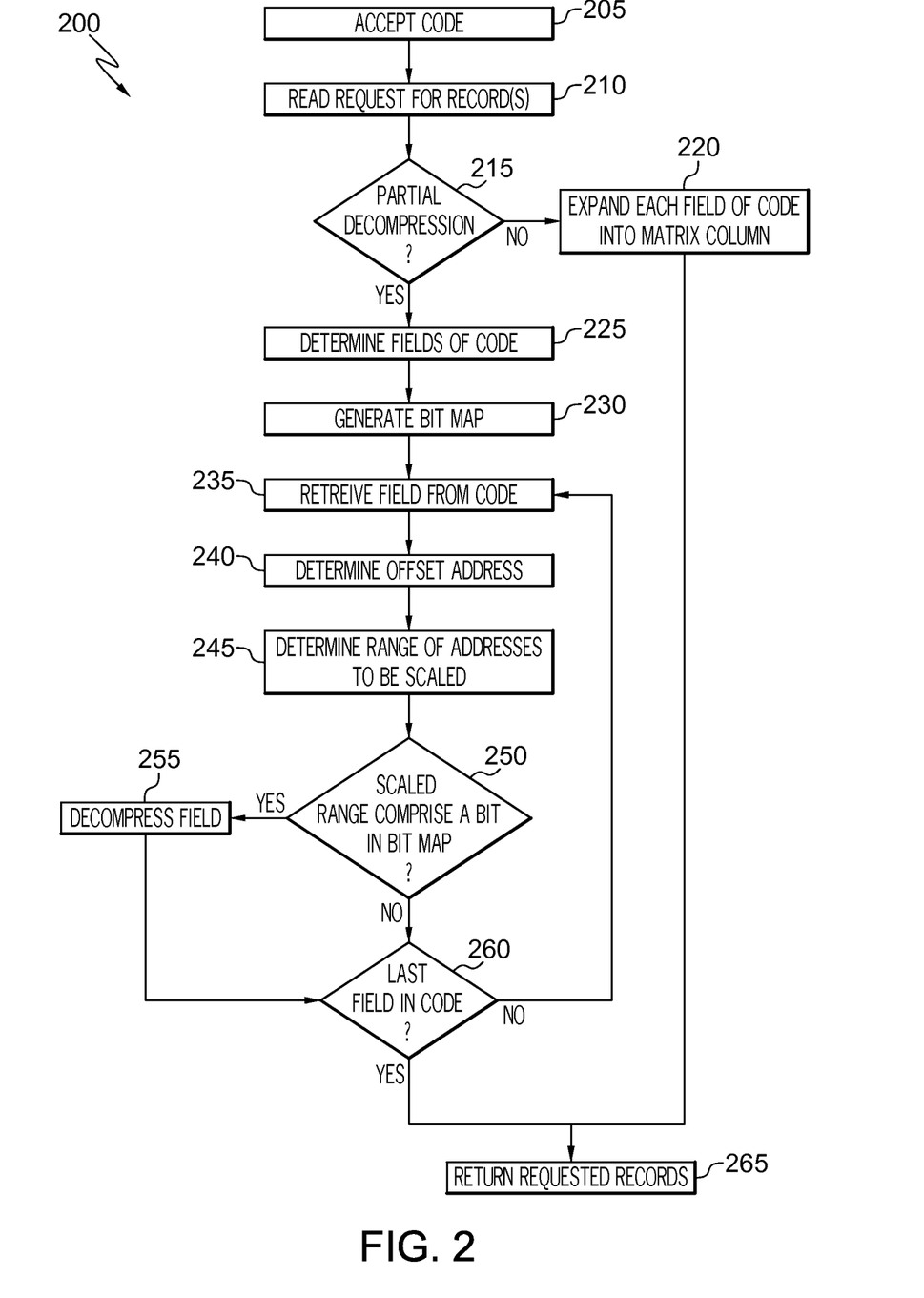
FIG. 2 shows a flowchart of a data decompression method.

FIG. 2 shows a flowchart of a data decompression method 200. Method 200 is adapted to work on a block of codes as obtainable from compression method 100.

Decompression method 200 begins in a step 205, in which a code is accepted. The code is of type one or type two as described above with respect to compression method 100.

In a following step 210, one or several requests for records are read. This step may be omitted if the complete contents of the code are to be decompressed. The request may have been generated on the basis of a search against the index described above with respect to step 120 of compression method 100. The result of the search may return an indication which fields inside the code contain the sought information.

In a step 215, it is determined whether partial decompression or full decompression of the code will be performed. In the case of full decompression, the decompression is carried out in a step 220 in which each of the fields inside the code is expanded into a column of a matrix, filling in appropriate recurrences of iterated fields in the case of iterated fields of a type two code. The matrix may then be logically transposed as described above with respect to step 135 of compression method 100 so that all records which were compressed in the code may be accessed as lines of the matrix. If required, the lines of the matrix may be reordered e.g. according to contents of the lines of the matrix, i.e. contents of the fields of the records.

If partial decompression is to be used, method 200 continues with a step 225 in which it is determined which parts of the requested records, i.e. lines of the matrix, are comprised by which fields of a code. If the matrix is stored in linearized form, e.g. in a computer memory, the required matrix elements will have addresses that can be expressed as offsets from a first address of the whole matrix. It may be advantageous to determine matches between the fields of a code and fields of a record on the basis of offset addresses of the matrix.

In an optional step 230, a bitmap is generated containing a number of bits that is preferably lower than the number of elements inside of the matrix. Each offset address in the matrix may thus be scaled to a bit address inside the bitmap by multiplying the offset address with a factor that is the quotient of the number of elements in the matrix by the number of elements in the bitmap. Bits of the bitmap that correspond to matrix offset addresses with information on the requested records will be set, while other bits will be reset (or vice versa). Thus, the bitmap represents an indication of codes to decompress wherein the indication is more coarse-grained than the offset addresses generated in step 225 and thus requires less comparison operations for identification of the corresponding fields to be decompressed from code, as carried out below.

In a step 235, a field is retrieved from the code. In a step 240, it is determined to which offset addresses of the matrix the code expands to. The determined range of addresses may be scaled in a step 245 with the factor of step 230 above.

In a step 250, it is determined whether the scaled range comprises a set bit in the bitmap of step 230. If this is the case, the field is decompressed in a step 255. Otherwise, in a step 260, it is determined if the present field is the last field in the code. If this is not the case, decompression 200 loops back to step 235 to proceed with the next field from the code.

Should the last field have been reached in step 260 or the full decompression been performed in step 220, the requested records are returned in a step 265.

Figure 3:
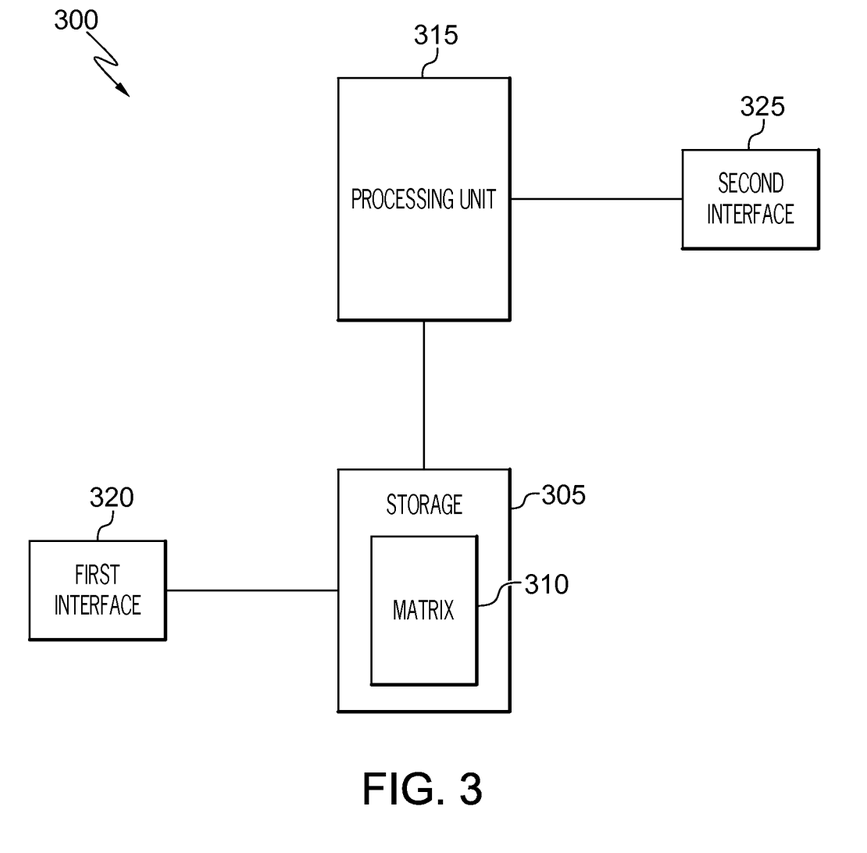
FIG. 3 shows a block diagram of a system for compression according to the method of FIG. 1.

FIG. 3 shows a block diagram of a system 300 for compression according to method 100 of FIG. 1.

System 300 comprises a storage 305 which holds a matrix 310 and a processing unit 315. The storage 305 may be filled through a first interface 320 and the processing unit 315 may output codes through a second interface 325. In other embodiments of the invention, the first interface 315 may also be connected to the processing unit 315.

System 300 is adapted to accept a stream of records through the first interface 320 and to output one or several blocks of codes with compressed records through the second interface 325. The system 300 is particularly adapted to carry out compression method 100 of FIG. 1. The codes provided through the second interface 325 will have the structure of the first and second type codes mentioned above with respect to FIG. 1. The system 300 may also be adapted to generate and associate an index with one or several generated blocks of codes. The index may contain information as mentioned above with respect to step 120 of compression method 100 of FIG. 1.

Figure 4:
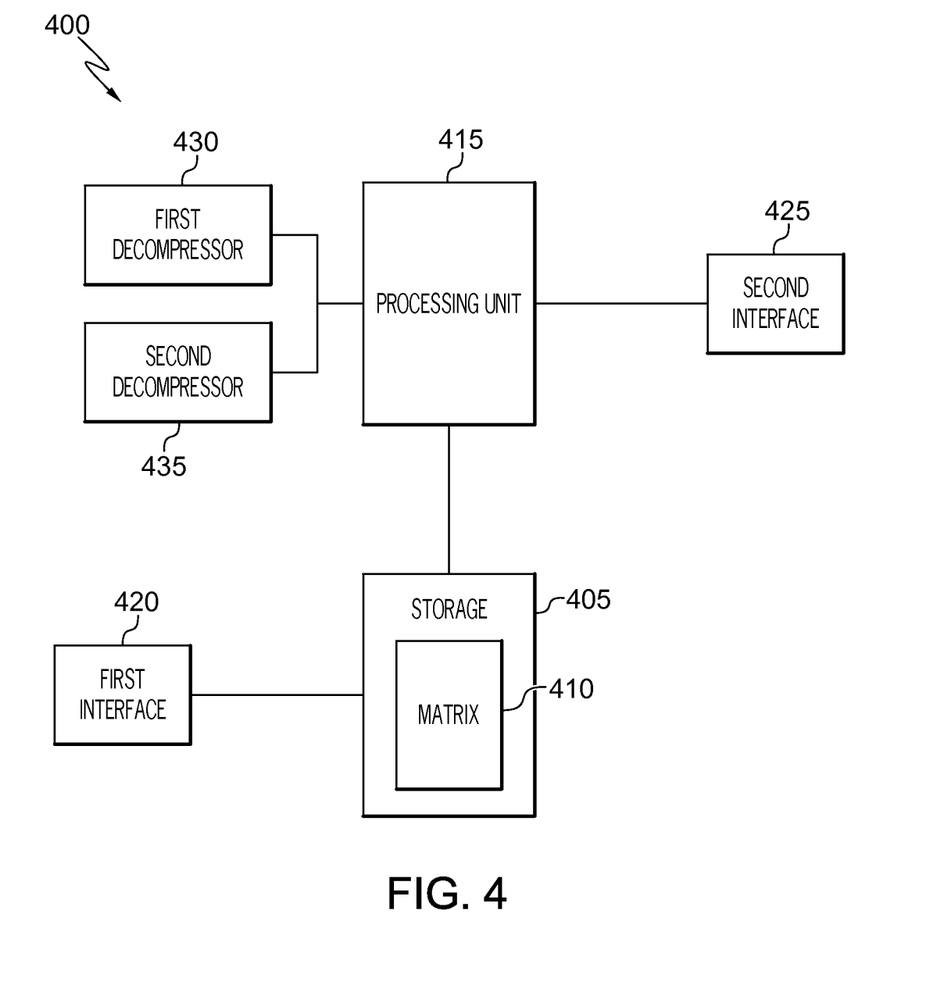
FIG. 4 shows a block diagram of a system for decompression according to the method of FIG. 2.

FIG. 4 shows a block diagram of a system 400 for decompression according to the decompression method 200 of FIG. 2. Decompression system 400 is particularly suited for executing decompression method 200 of FIG. 2. Like compression system 300 of FIG. 3, the decompression system 400 of FIG. 4 may advantageously be implemented through a programmable computer or microcomputer. System 400 comprises a storage 405 containing a matrix 410, a processing unit 415, a first interface 420 and a second interface 425, all of which elements correspond to elements in the compressing system 300 of FIG. 3. Furthermore, there is provided a first decompressor 430 for decompressing codes of the first type and a second decompressor 435 for decompressing codes of the second type, both codes as mentioned above with respect to FIG. 1.

In another embodiment of the invention, one or both of the decompressors 430, 435 may be comprised by processing unit 415.

Figure 5:
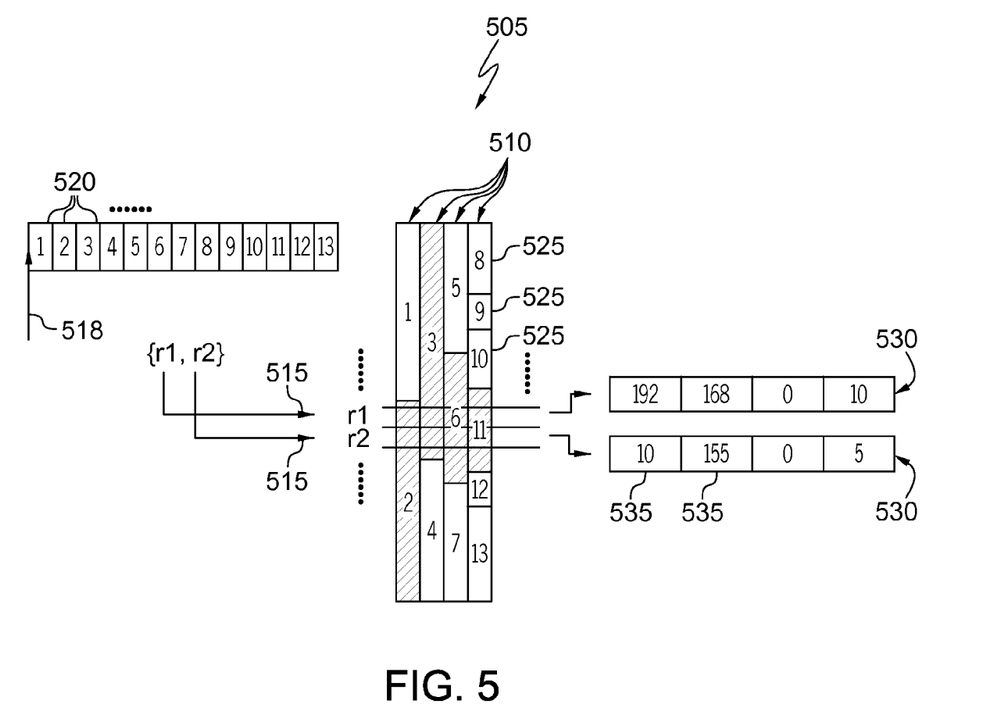
FIG. 5 shows an illustration of partial and full decompression according to the decompression method of FIG. 2.

FIG. 5 shows an illustration of partial and full decompression according to the decompression method 200 of FIG. 2.

In the center of FIG. 5, a matrix 505, corresponding to the table of step 110, the table referenced above with respect to FIG. 2, and matrices 310, 410 of systems 300 and 400, respectively. Table 505 is organized in columns 510 and rows (lines) 515. The table 505 is adapted to hold all the decompressed information of one block 518 of codes 520. Each code 520 is in the format of a first code or a second code, as described above with respect to step 145 in compression method 100 in FIG. 1.

For a full decompression of the block 518 of codes 520, all codes 520 are one-by-one expanded into fields 525 and filed into columns 510 of matrix 505. It can be seen that e.g. the codes 520 labeled "1" and "2" expand into fields 525 that represent much longer portions of a column 510 of the table 505 than e.g. the fields 525 corresponding to codes 520 labeled "8" and "9". This is due to the fact that in codes 520 labeled "1" and "2", a larger number of repeated fields exist so that the compression ratio of these codes 520 is higher.

After the thirteen codes 520 of the block of codes 518 have been expanded into the table 505, all columns 510 are assigned with fields of decompressed records. Each decompressed record 530 is found in one row 515 of table 505. In order to access the individual records 530, a simple line-wise access to table 505 can be facilitated.

Partial decompression of block 518 will now be explained with reference to an example in which only the records of rows 515 labeled R1 and R2 are requested. In the table 505, fields 525 that need to be decompressed in order to contribute to a portion of a row R1 or R2 are shaded. The shaded fields 525 comprise those with labels 2, 3, 6 and 11.

The number of rows 515 an expanded field 525 occupies after decompression may be determined by multiplying the size of the field with the number of iterations associated with the field 525. Thus, the position of a successive field inside of a column 510 in matrix 505 can be determined without actually decompressing any previous field 525. Therefore, the fields 525 that are not shaded inside of table 505 need not be decompressed in order to provide the correct contents of rows R1 and R2.

Exemplary records 530 which are stored inside rows 515 labeled R1 and R2 are shown in the right-hand side of FIG. 5. Each record 530 comprises several fields 535.

Figure 6:
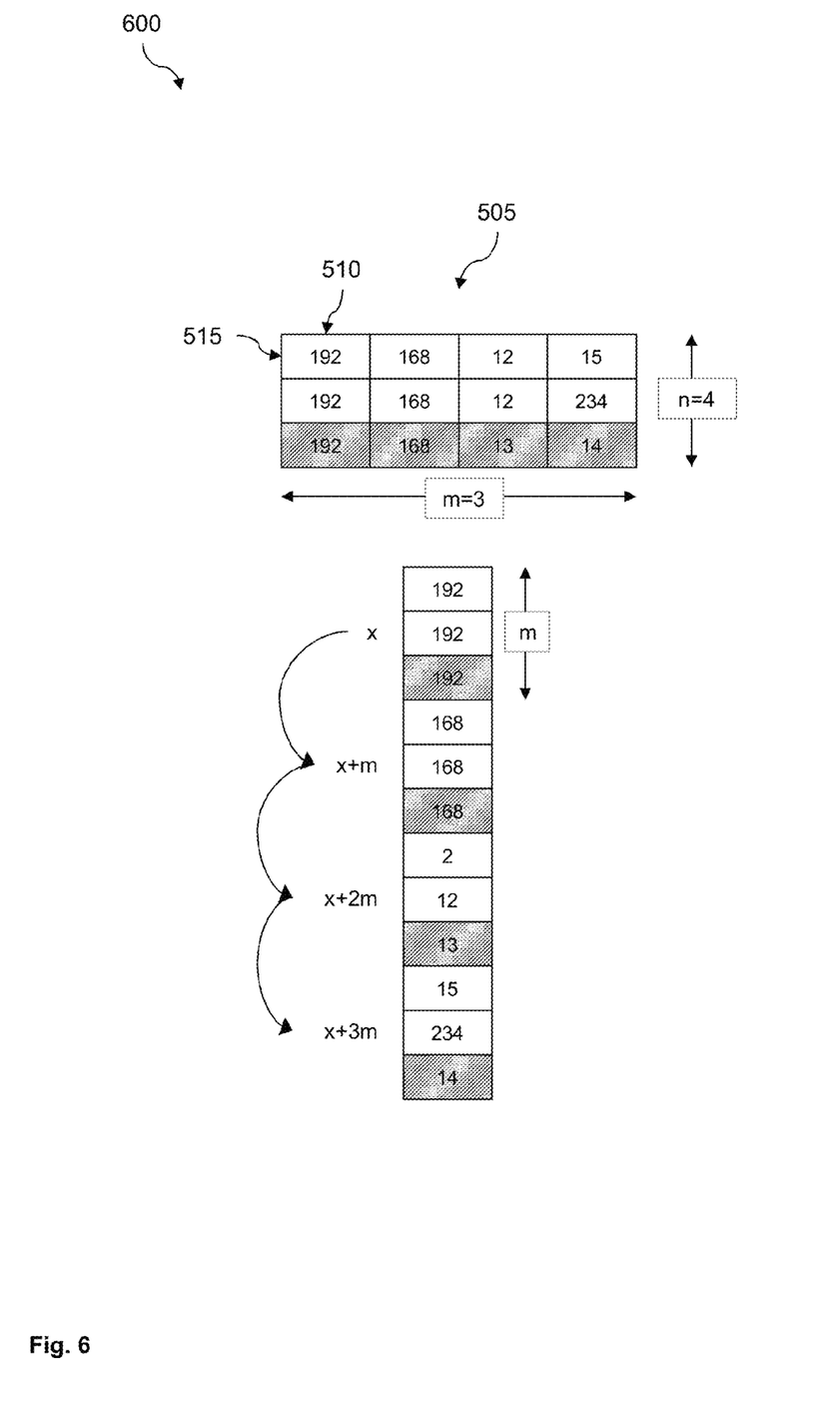
FIG. 6 shows an illustration of determining offset addresses in a linearized matrix according to the decompression method of FIG. 2.

FIG. 6 shows an illustration 600 for determining offset addresses in a linearized matrix according to the decompression method 200 of FIG. 2.

In the upper portion of FIG. 6, matrix 505 with columns 510 and rows 515 of FIG. 5 is shown in another embodiment. The number n of columns 510 is 4 and the number m of rows (lines) 515 is 3. Elements of matrix 505 are shown with exemplary content.

In the lower portion of FIG. 6, matrix 505 is shown in a linearized form. The linearized form is used e.g. if matrix 505 is stored in a computer memory with linear addresses. In this case, the top-most element of matrix 505 which corresponds to the first column 510 and the first row 515, is assigned a base address of matrix 505. Other elements can be accessed through an offset address that denotes a number of addresses from the base address. Consecutive addresses correspond to successive elements of the same column 510 and increasing rows 515. After the elements of the first column 510, the elements of the next column 510 are stored in a similar manner. The rest of the columns 510 of table 505 follow in the same way.

In order to access the linearized matrix 505 in a row-based fashion, starting e.g. in the first column 510 and the third row 515, the first element is found at offset address three and consecutive elements of the same row 515 are accessed at intervals of m (=3) elements from there. Thus, transposing matrix 505 in its linearized form may be implemented by simply changing the address schemes of row-based addressing and column-based addressing.

Figure 7:
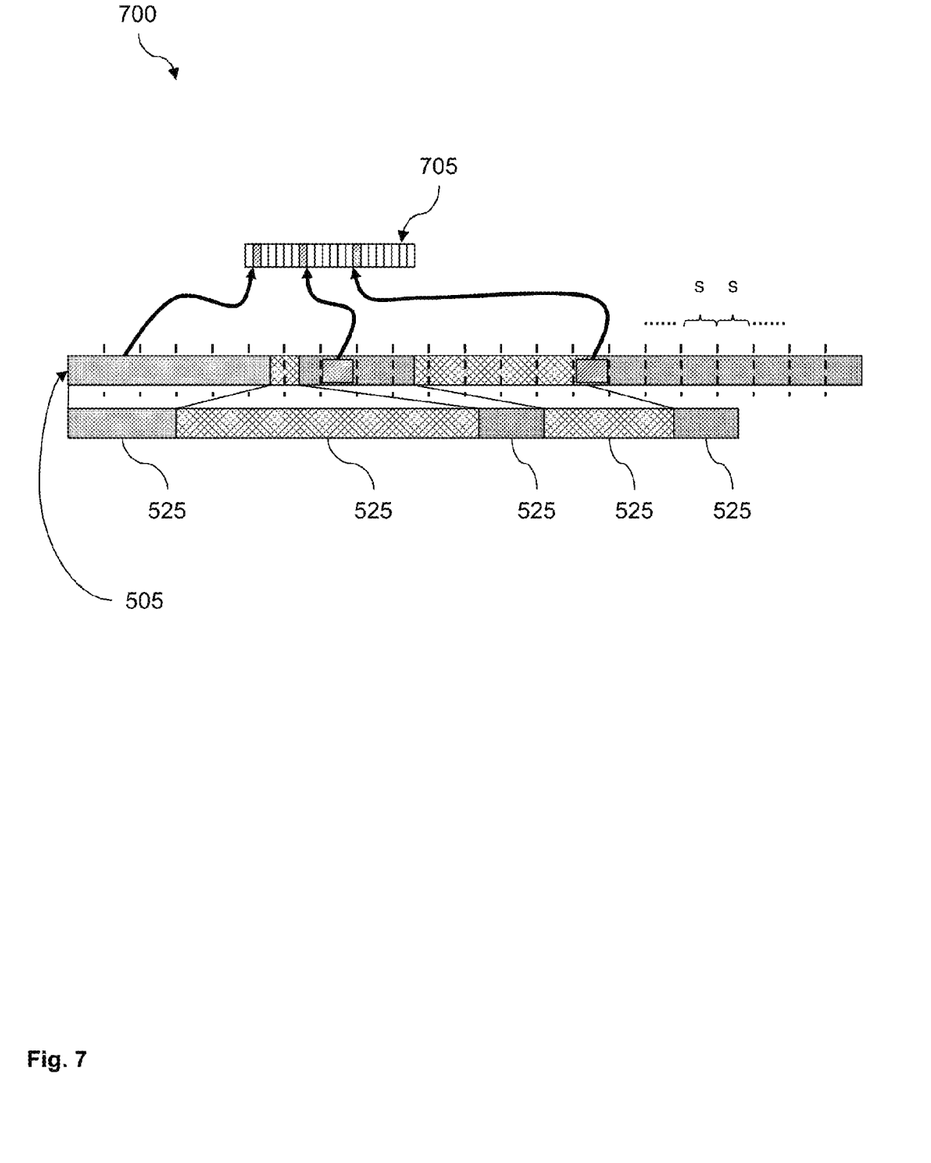
FIG. 7 shows an illustration of a bitmap based determination of blocks to decompress according to the decompression method of FIG. 2.

FIG. 7 shows an illustration 700 of bitmap based determination of fields to decompress according to the decompression method 200 of FIG. 2.

In the shown example, a series of five fields 525 of FIG. 5 are expanded into table 505 which is displayed in its linearized form in the center of FIG. 7. The linearized matrix 505 is subdivided into s segments. Borders between the s segments do not necessarily coincide with borders between elements of the linearized matrix 505 since the numbers of segments s is smaller than the number of elements inside of matrix 505.

Each of the s segments is assigned one bit in a bitmap 705. The corresponding bit inside bitmap 705 is set if and only if an element of matrix 505 that lies within the boundaries of the corresponding segment s needs to be decompressed.

The scheme for determining which codes 520 need to be decompressed for a given row or a set of rows, as explained above with respect to FIG. 5, may be implemented with a lower number of comparisons to perform between offset addresses of a requested row and offset addresses of an expanded field 525 in the linearized matrix 505.

Once the bitmap 705 has been populated with the correct bits, the codes 520 may be inspected one by one to determine the range of offset addresses they will expand to inside of matrix 505. Upper and lower limits of these ranges are transposed to indices of bitmap 705 by multiplying the limits with the quotient of the number of elements inside of matrix 505 by the number of segments s. Should any bit inside of bitmap 705 between the determined bitmap addresses be set, the corresponding code 520 needs to be decompressed.

The number of segments s is a tunable parameter. The larger the number of segments s is with respect to the number of elements inside the matrix 505, the higher the precision of the determination will be, i.e. the lower the probability is that any code 520 will be decompressed that contains no information that is part of a requested row. On the other hand, the lower the number of segments is, the less comparisons need to be drawn in order to figure out whether or not a code 520 needs to be decompressed.

Figure 8:
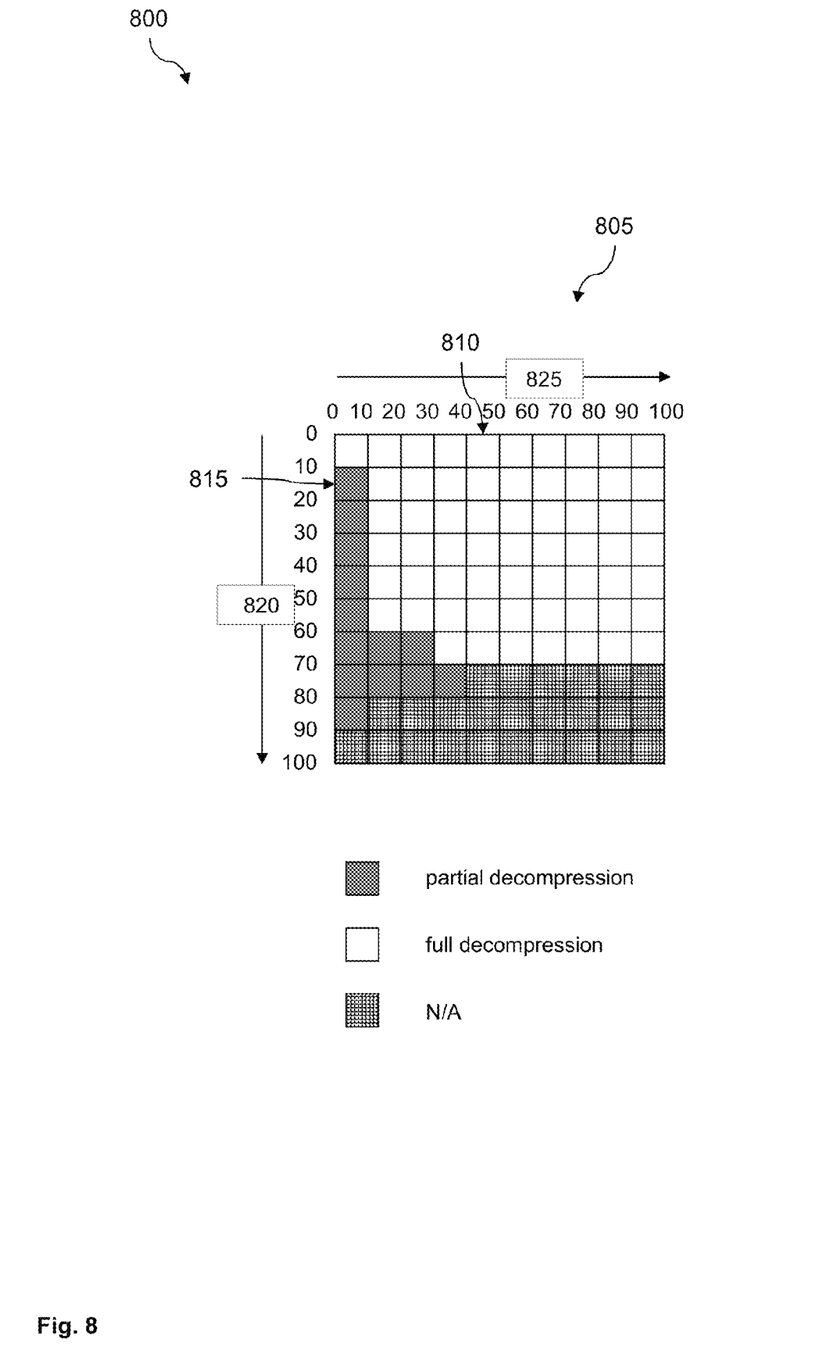
FIG. 8 shows an illustration of table based decision making whether to use full or partial decompression according to the method of FIG. 2.

FIG. 8 shows an illustration 800 of a table based decision making process whether to use full or partial decompression of a code according to the decompression method 200 of FIG. 2. The decision making discussed below is specifically adapted to be carried out inside of step 215 of method 200.

A table or matrix 805 is provided in ten columns 810 and ten rows (lines) 815. Other embodiments may employ different numbers of columns 810 and/or rows 815. Columns 810 are assigned to a selectivity parameter given as a percentage, and rows 815 are assigned to a compression ratio parameter also given as a percentage.

As described above, the selectivity describes how many records are requested for decompression out of a code 520 with respect to the number of records that are compressed inside the code 520. The compression ratio describes the ratio of the size of a code 520 by the size of the decompressed matrix 505. Both the selectivity and the compression ratio parameter are obtainable for a code 520 without decompressing any of the fields 525.

In each element of table 805, there is stored an indication on whether it is more advantageous to carry out full decompression of a block 518 of codes 520 or a partial decompression for the given combination of selectivity and compression ratio.

For instance, if selectivity is high and compression ratios are moderate or low, full decompression may be advisable, as can be seen from the white shading of elements of table 805 towards the upper right-hand corner. On the other hand, partial decompression may be advisable when selectivity is low and the decompression ratio is moderate, as can be seen from the dark shading of table 805 towards the left. In the given example of FIG. 8, no indication is available when the compression ratio is high, as is indicated by the chequer pattern towards the lower end of table 805.

To populate table 805, representative codes 520 for a kind of data of interest may be decompressed both partially and fully in order to find out which strategy consumes less computing effort. The computing effort may for instance be given as a number of clock cycles of a processing unit. Table 805 may also be populated during decompression according to method 200 of FIG. 2 in that every time a combination between selectivity and compression ratio is found for which there is no information available inside of table 805, both full and partial decompression are carried out and an indication of the less effort consuming method may be written into the corresponding cell of table 805. Computing efforts in table 805 may also be verified occasionally and updated if necessary.

It should be noted that the above depiction is only exemplary, not intended for limiting the present invention. In other embodiments of the present invention, this method may have more, or less, or different steps, and numbering the steps is only for making the depiction more concise and much clearer, but not for stringently limiting the sequence between each steps, while the sequence of steps may be different from the depiction.

Thus, in some embodiments, the above one or more optional steps may be omitted. Specific implementation of each step may be different from the depiction. All these variations fall within the spirit and scope of the present invention.

The present invention may adopt a form of hardware embodiment, software embodiment or an embodiment comprising hardware components and software components. In a preferred embodiment, the present invention is implemented as software, including, without limitation to, firmware, resident software, micro-code, etc.

Moreover, the present invention may be implemented as a computer program product usable from computers or accessible by computer-readable media that provide program code for use by or in connection with a computer or any instruction executing system. For the purpose of description, a computer-usable or computer-readable medium may be any tangible means that can contain, store, communicate, propagate, or transport the program for use by or in connection with an instruction execution system, apparatus, or device.

The medium may be an electric, magnetic, optical, electromagnetic, infrared, or semiconductor system (apparatus or device), or propagation medium. Examples of the computer-readable medium would include the following: a semiconductor or solid storage device, a magnetic tape, a portable computer diskette, a random access memory (RAM), a read-only memory (ROM), a hard disk, and an optical disk. Examples of the current optical disk include a compact disk read-only memory (CD-ROM), compact disk-read/write (CR-ROM), and DVD.

A data processing system adapted for storing or executing program code would include at least one processor that is coupled to a memory element directly or via a system bus. The memory element may include a local memory usable during actually executing the program code, a mass memory, and a cache that provides temporary storage for at least one portion of program code so as to decrease the number of times for retrieving code from the mass memory during execution.

An Input/Output or I/O device (including, without limitation to, a keyboard, a display, a pointing device, etc.) may be coupled to the system directly or via an intermediate I/O controller.

A network adapter may also be coupled to the system such that the data processing system can be coupled to other data processing systems, remote printers, or storage devices via an intermediate private or public network. A modem, a cable modem, and an Ethernet card are merely examples of a currently usable network adapter.

It is to be understood from the foregoing description that modifications and alterations may be made to the respective embodiments of the present invention without departing from the true spirit of the present invention. The description in the present specification is intended to be illustrative and not limiting. The scope of the present invention is limited by the appended claims only.

What is claimed is:

1. A method for decompressing records from a block of codes, the method for decompression comprising:
    for each code that is to be extracted from the block:
    determining a type of the code;
    decompressing a sequence of individual fields if the code is of a first type; and
    decompressing the sequence of repeated fields if the code is of a second type; and
    a preceding determination of which codes must be decompressed for obtaining a predetermined record, wherein the fields are extracted into a matrix with lines representing records, the matrix is addressable in linearized form such that each field of each record has an offset address in the linearized matrix, and the preceding determination comprises the steps of:
    determining an offset address for each field of the predetermined record;
    linearly rescaling the determined offset addresses with a predetermined factor and setting a bit in a bitmap at the rescaled offset address to a predetermined value;
    for each code in the block:
    determining a range of offset addresses to which the code decompresses;
    linearly rescaling the range of offset addresses with the predetermined factor; and
    determining that the code must be decompressed if the bitmap contains a bit with the predetermined value at a rescaled address that falls within the rescaled range of offset addresses.

2. The method according to claim 1, further comprising a preceding determination whether to decompress all codes of the block or to employ partial decompression, wherein the preceding determination is carried out on the basis of at least one of:
    a compression ratio indicating a quotient of a size of the block of codes by a size of the decompressed records; and
    a selectivity indicating a quotient of the number of records to be decompressed by the number of records in the block.

3. The method according to claim 2, wherein the preceding determination whether to use full or partial decompression is done on the basis of a table indicating the method to use for different combinations of compression ratio and selectivity.

4. The method according to claim 3, wherein elements of the table hold an indication of an average effort for carrying out full and/or partial decompression.

5. An apparatus for compressing a sequence of records, each record comprising a sequence of fields, the method comprising:
    a memory;
    a processor communicatively coupled to the memory for performing:
    buffering a record in a line of a matrix;
    reordering the lines of the matrix according to locality sensitive hash values of the buffered records such that records with similar contents in corresponding fields are placed in proximity;
    consolidating fields in columns of the matrix into a block of codes; and
    consolidating yields codes of one of a first type comprising a sequence of individual fields and a second type comprising a sequence of fields with at least one repetition,
    wherein the second type of code comprises a presence field indicating repeated fields and an iteration field indicating the number of respective repetitions;
    the apparatus further comprising:
    decompressing records from a block of codes, for each code that is to be extracted from the block;
    determining the type of the code;
    decompressing the sequence of individual fields if the code is of the first type; and
    decompressing the sequence of repeated fields if the code is of the second type;
    a preceding determination of which codes must be decompressed for obtaining a predetermined record, wherein the fields are extracted into a matrix with lines representing records, the matrix is addressable in linearized form such that each field of each record has an offset address in the linearized matrix, and the preceding determination comprises the steps of:
    determining an offset address for each field of the predetermined record;
    linearly rescaling the determined offset addresses with a predetermined factor and setting a bit in a bitmap at the rescaled offset address to a predetermined value;
    for each code in the block:
    determining a range of offset addresses to which the code decompresses;
    linearly rescaling the range of offset addresses with the predetermined factor; and
    determining that the code must be decompressed if the bitmap contains a bit with the predetermined value at a rescaled address that falls within the rescaled range of offset addresses.

6. The apparatus according to claim 5, further comprising a preceding determination whether to decompress all codes of the block or to employ partial decompression according, wherein the preceding determination is carried out on the basis of at least one of:

a compression ratio indicating a quotient of a size of the block of codes by a size of the decompressed records; and     a selectivity indicating a quotient of the number of records to be decompressed by the number of records in the block.

7. The apparatus according to claim 6, wherein the preceding determination whether to use full or partial decompression is done on the basis of a table indicating the method to use for different combinations of compression ratio and selectivity.

8. The apparatus according to claim 7, wherein elements of the table hold an indication of an average effort for carrying out full and/or partial decompression.

\* \* \* \* \*